(12) United States Patent  
Black, Jr. et al.

(10) Patent No.: US 6,693,826 B1
(45) Date of Patent: Feb. 17, 2004

(54) MAGNETIC MEMORY SENSING METHOD AND APPARATUS

(75) Inventors: William C. Black, Jr., Ames, IA (US); Ruili (Linda) Zhang, Winston-Salem, NC (US)

(73) Assignee: Iowa State University Research Foundation, Inc., Ames, IA (US)

( * ) Notice: Subject to any disclaimer, the term of this patent is extended or adjusted under 35 U.S.C. 154(b) by 7 days.

(21) Appl. No.: 10/208,935

(22) Filed: Jul. 29, 2002

Related U.S. Application Data
(60) Provisional application No. 60/308,708, filed on Jul. 30, 2001.

(51) Int. Cl.[7] ................................................. G11C 7/00
(52) U.S. Cl. ...................................... 365/173; 365/158
(58) Field of Search ........................... 365/189.01, 173, 365/158, 171, 205

(56) References Cited

U.S. PATENT DOCUMENTS

| | | |
|---|---|---|
| 4,731,757 A | 3/1988 | Daughton et al. |
| 4,751,677 A | 6/1988 | Daughton et al. |
| 4,754,431 A | 6/1988 | Jenson |
| 4,780,848 A | 10/1988 | Daughton et al. |
| 4,829,476 A | 5/1989 | Dupuis et al. |
| 4,857,418 A | 8/1989 | Schuetz |
| 4,897,288 A | 1/1990 | Jenson |
| 4,918,655 A | 4/1990 | Daughton |
| 4,945,397 A | 7/1990 | Schuetz |
| 4,953,002 A | 8/1990 | Nelson et al. |
| 5,012,444 A | 4/1991 | Hurst, Jr. et al. |
| 5,019,461 A | 5/1991 | Schuetz |
| 5,060,193 A | 10/1991 | Daughton et al. |
| 5,064,499 A | 11/1991 | Fryer |
| 5,349,302 A | 9/1994 | Cooper |
| 5,496,759 A | 3/1996 | Yue et al. |
| 5,569,617 A | 10/1996 | Yeh et al. |
| 5,636,159 A * | 6/1997 | Pohm .......................... 365/158 |
| 5,640,343 A * | 6/1997 | Gallagher et al. ........... 365/171 |
| 5,748,519 A | 5/1998 | Tehrani et al. |
| 5,756,366 A | 5/1998 | Berg et al. |
| 5,838,608 A | 11/1998 | Zhu et al. |
| 5,939,772 A | 8/1999 | Hurst et al. |
| 5,956,267 A | 9/1999 | Hurst et al. |
| 5,982,658 A | 11/1999 | Berg et al. |
| 6,021,065 A | 2/2000 | Daughton et al. |
| 6,027,948 A | 2/2000 | Jensen et al. |
| 6,048,739 A | 4/2000 | Hurst et al. |
| 6,128,214 A | 10/2000 | Kuekes et al. |
| 6,147,900 A | 11/2000 | Pohm |
| 6,147,922 A | 11/2000 | Hurst, Jr. et al. |

(List continued on next page.)

OTHER PUBLICATIONS

Bobo, J., Mancoff, F.B., Bessho, K., Sharma, M., Sin, K., Guarisco, D., Wang, S.X., Clemens, B.M., "Spin Dependent Tunneling Junctions with Hard Magnetic Layer Pinning", J. Appl. Phys. 83, 6685–87, American Institute of Physics 1998.

(List continued on next page.)

Primary Examiner—Vu A. Le
(74) Attorney, Agent, or Firm—McKee, Voorhees & Sease, P.L.C.

(57) ABSTRACT

A method and apparatus for characterizing and sensing the stability of a magnetic memory element. The method comprises setting a reference threshold, reading the state signal of the memory element, and comparing the magnitude of the state signal to the reference threshold, such that a state signal exceeding the reference threshold is considered stable. The apparatus comprises a reference generator having an output that is compared, in a windowed comparator, to the state signal magnitude, such that an output signal of the windowed comparator can be used to characterize the stability of the memory element.

47 Claims, 9 Drawing Sheets

U.S. PATENT DOCUMENTS

| | | |
|---|---|---|
| 6,109,687 A1 | 1/2001 | Johnson |
| 6,175,525 B1 | 1/2001 | Fulkerson et al. |
| 6,178,111 B1 | 1/2001 | Sather et al. |
| 6,178,131 B1 | 1/2001 | Ishikawa et al. |
| 6,269,027 B1 | 7/2001 | Hurst et al. |
| 6,317,359 B1 | 11/2001 | Black et al. |
| 6,343,032 B1 | 1/2002 | Black et al. |

OTHER PUBLICATIONS

Prinz, Gary A., "Magnetoelectronics", Science, vol. 282, Nov. 27, 1998, "Science's Compass" review section (4 pages).

"Spin Dependent Tunnel Juctions; Clemens Group Spin Dependent Tunneling Project", (1 page), abstract referring to Bobo, J., et al., "Spin Dependent Tunneling Junctions with Hard Magnetic Layer Pinning", J. Appl. Phys. 83, 6685, downloaded from http://www-mse.stanford.edu/faculty/clemens/tunnelproj.html, Jul. 7, 1999.

Textbook entitled "MOS Digital Circuits", Sec. 13.7 entitled "Latches and Flip Flops", 944–47.

Textbook chapter 8 entitled "Regenerative Circutis", 452–55.

Tehrani, et al., "High Density Nonvolatile Magnetoresistive RAM", Motorola, Inc., Phoenix Research Lab., 7.7.1–.4, IEEE 1996.

Zhang, R., Black, W.C., Hassoun, M., "Windowed MRAM Sensing Scheme", published at 2000 IEEE International Workshop, Aug. 7, 2000 (6 pgs).

Carley, R.L., Ganger, G. R., Nagle, D.F.; "MEMS–Based Integrated–Circuit Mass–Storage Systems";Communications of the ACM; Nov. 2000/Vol 43. No. 11; pp. 73–80.

Hassoun, M. M., Black , Jr., W.C., Lee, E. K. F., Geiger, R.L., Hurst,Jr., A.; IEEE Transactions on Magnetics, vol. 33 No. 5 Sep. 1997; pp. 3307–3309.

* cited by examiner

MAGNETIC MEMORY SENSING METHOD AND APPARATUS

REFERENCE TO RELATED APPLICATION

Reference is made to, and this application is based on, U.S. Provisional Patent Application Serial No. 60/308,708, filed Jul. 30, 2001.

INCORPORATION BY REFERENCE

The entire contents of U.S. Provisional Application Serial No. 60/308,708, filed Jul. 30, 2001, is incorporated by reference herein.

GRANT REFERENCE

Work for this invention may have been funded in part by a grant from the Defense Advanced Research Projects Agency (DARPA), DARPA Contract No. N00014-C-2114 through Honeywell Subcontract No. M56275GF. The government may have certain rights in this invention.

BACKGROUND OF THE INVENTION

1. Field of the Invention

The present invention relates to high density, non-volatile memory. One aspect of the invention pertains to on-chip magnetic memory elements (sometimes known as MRAM). However, the general invention is believed applicable to a variety of magnetic memory configurations. This could include conventional integrated memory that is electronically selected. But further, it could include moving or moveable memory such as hard drives, floppy discs, and the like, as will become apparent with reference to the specification herein. More particularly, the present invention relates to the detection of unstable states in magnetic memory that could result in erroneous memory operation, e.g. affect accuracy of the data read from memory or cause reduced reliability of the memory. MRAM possibly can have non-movable or moveable implementations, as has been suggested in the literature. See, e.g., L. Richard Carley, Gregory R. Ganger, and David F. Nagle, MEMS-Based Integrated-Circuit Mass-Storage Systems. in COMMUNICATIONS OF THE ACM, November 2000, Vol.43, No.11, which is incorporated by reference herein.

2. Problems with the Art

Many types of storage technologies exist today. One type of storage technology or memory is magneto-resistive RAM or MRAM. MRAM includes various implementations including giant magneto-resistance (GMR) embodiments. Other examples of MRAM include, but are not necessarily limited to AMR, CMR, and SDT or TMR embodiments. MRAM has many desirable properties including random accessibility, very short write times, density close to dynamic RAM, sizes scaleable with lithography, very little cost, radiation hardness, and non-volatility.

A variety of other memory configurations and implementations exist, as are well known in the art. These include what will be referred to as "moving memory", to differentiate it from conventional integrated memory that is electronically selected. One example is a hard drive, having a disc or other magnetic storage media that moves past a read and/or write head. Alternatively, the term "moving memory" will also refer to configurations where a read and/or write head moves past a magnetic memory, or both move relative to each other. There are also implementations being developed that utilize magnetic material, without necessarily any partitioned or segregated structure, as a storage location for data.

The concept of magneto-resistance is that when ferromagnetic materials are subjected to a magnetic field, the electrical resistance can change. This is generally known as the magnetoresistance effect and may be observed to occur in many types of both single and composite films of magnetic materials. What makes this effect useful in a magnetic memory is that the magnetic orientation, or relative magnetic orientations of multiple layers may be set by manufacturing or writing of data and then sensed by way of this predictable resistance change. This is useful in both "moving memory" where the sensing element may be shared over many memory bits and in MRAM, where there is effectively one sense element per storage element. One popular type of MRAM makes use of a giant magneto-resistance (GMR) resistor. Publicly available literature currently discloses several other types, including a variety of implementations of GMR techniques and what are known as AMR, CMR, and SDT or TMR configurations. For purposes of illustration and example, magnetic memory in the form of a GMR resistor will be primarily discussed herein, but it is to be understood that the concepts discussed have applicability to the variety of magnetic memory types available, discussed, or contemplated in the art. It is believed the invention will also have applicability to many, if not all, future implementations of magnetic memory using magnetoresistive properties.

Figure 1:
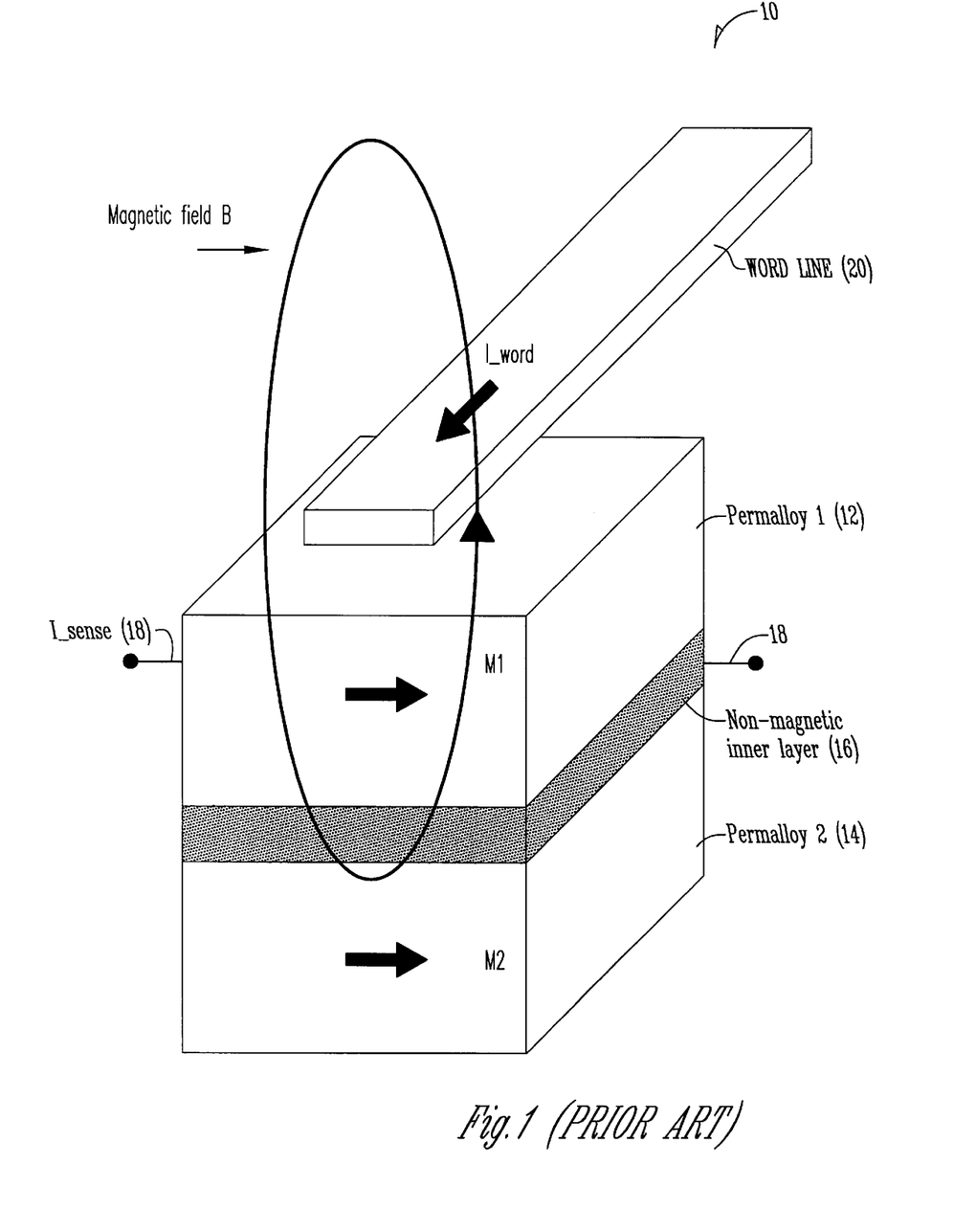
FIG. 1 is a diagram of a prior art GMR element showing a conventional sensing scheme.

One implementation of a GMR resistor uses a pair of magnetic thin films having the configuration shown in FIG. 1. In FIG. 1, a GMR bit 10 is shown. The GMR bit 10 includes an upper layer 12 and a bottom layer 14. The upper and bottom layers are magnetic layers and are typically composed at least in part of permalloy. The upper layer 12 is sometimes designated as M1 and the lower layer 14 is sometimes designated as M2 to denote that these are magnetic layers. Between these magnetic layers 12 and 14 is an inner layer 16 which is nonmagnetic, and for the GMR case, is a conductive film such as copper. The magnetic layers 12 and 14 typically have magnetic moments aligned along an axis set during manufacturing but for this case we consider to be aligned either to the "left" or to the "right."

Examples of such magnetic devices, including GMR, tunneling devices, or other implementations, are described in the following publications and in the references cited in these publications, all of which are incorporated by reference herein:

(a) W. C. Black, Jr. and B. Das, "Programmable logic using giant-magnetoresistance and spin-dependent tunneling devices", *Journal of Applied Physics*, Vol. 87, No. 9, Parts 2 and 3, May 1, 2000, pp. 6674–6679;

(b) R. Zhang, M. Hassoun, W. J. Black, Jr., B. Das, K. Wong, "Demonstration of A Four State Sensing Scheme For A Single Pseudo-Spin Valve GMR Bit", *IEEE Transactions on Magnetics*, September 1999;

(c) W. C. Black, Jr. and M. Hassoun, U.S. Pat. No. 6,317,359, "Non-Volatile Magnetic Circuit";

(d) W. C. Black, Jr., B. Das, M. Hassoun, U.S. Pat. No. 6,343,032, Non-Volatile Spin Dependent Tunnel Junction Circuit.

There are varieties of MRAM cells. For example, the bits may be of a "spin-valve" design where one of the layers is magnetically "pinned" in one direction or a "pseudo-spin-valve", where both layers are free to rotate but where one of the layers usually requires a greater field to switch its orientation.

Both spin valve and the pseudo-spin-valve varieties of memories have been used with various sensing schemes including non-destructive read out (NDRO) schemes. The advantage of non-destructive read out being that the memory may be read without changing the state in the memory. The current that runs through the GMR bit 10 as shown in FIG. 1 is commonly referred to as the sense current as it is used to determine or sense the state of the memory. The layer that runs either above, below or both above and below the GMR bit (shown in FIG. 1 as reference numeral 20) is commonly referred to as the word current as it is used to generate a controlled magnetic field to set the state of the memory during writing or produce a known magnetic field during reading. It should be noted that both sense and word line currents are important for setting the magnetic domains within the memory bit and this relationship is sometimes reflected in an "asteroid curve". By proper circuit biasing it may be possible to take advantage of this curve by using sense and word line currents together for X-Y addressing purposes, but there may also be additional current lines in the vicinity of the bit used for unique addressing purposes (sometimes known as 'digit' lines).

Figure 2A:
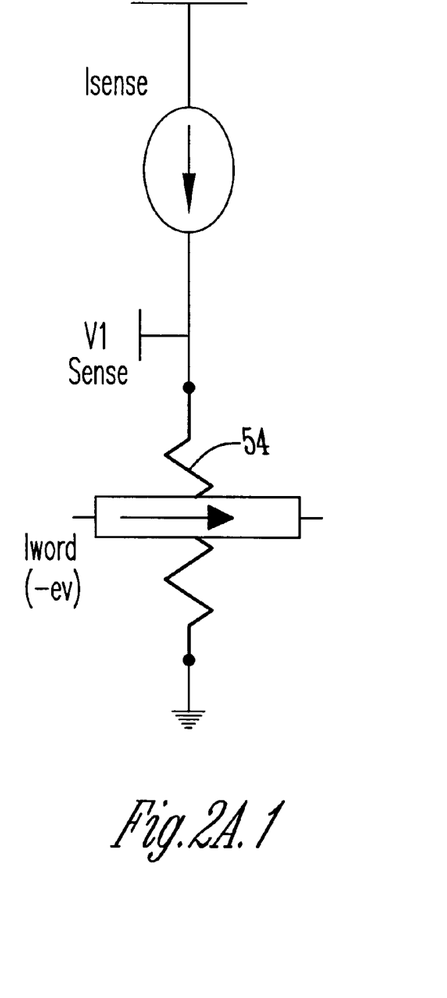
FIG. 2A is a diagram showing sequentially sensing of a GMR element, by measuring resistance through the device when write current of sufficient magnitude is sent in one direction through the element (FIG. 2A.1) and when sent in an opposite direction (FIG. 2A.2).
FIG. 2B is a diagram showing prior art dummy sensing of a GMR element.
Figure 2A:
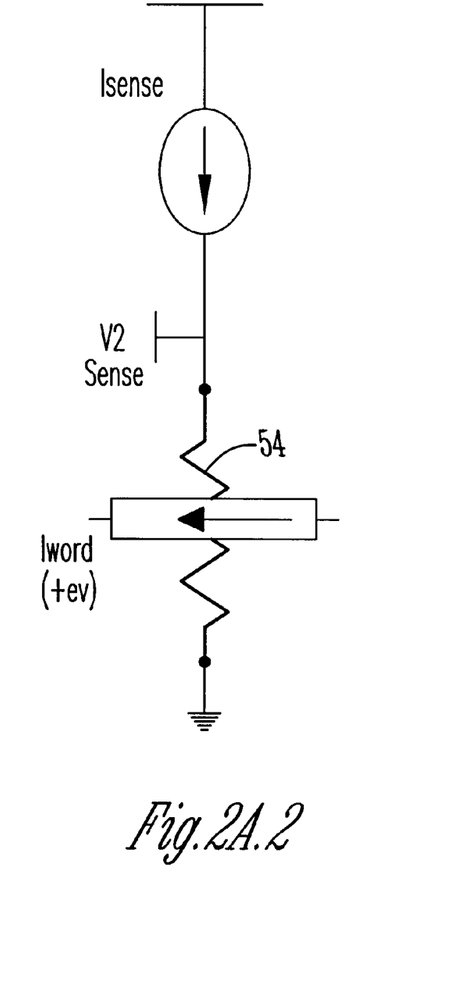

Different types of sensing schemes are known in the art. These prior art sensing methods include sequential sensing and dummy sensing. In sequential sensing, usually a word current is changed sequentially (such as applied in opposite directions sequentially) through the same GMR device, and the measured difference in resistance is compared to determine the state. For some types of memories it may be advantageous to switch direction of the sense current, or both the sense and word currents. See illustration of FIG. 2A.1 showing diagrammatically measuring R1 by sending Iword (−ev) through the word line relative the GMR device 54, and then in FIG. 2A.2, measuring R2 by sending Iword (+ev) through the word line. The memory states can be arbitrarily defined such that either or both layers may store data although one layer may also be used only for reading. The advantage of using one layer for reading is that non-destructive read-out schemes are easily implemented whereas use of both layers for data storage usually results in at least one layer being read-out destructively. An example of a four state sensing scheme can be found at R. Zhang, M. Hassoun, W. Black, Jr., B. Das, K. Wong, "Demonstration of a Four State Sensing Scheme for a Single Pseudo-Spin Valve GMR Bit", *IEEE Transactions on Magnetics*, September 1999, incorporated by reference herein. For purposes of example and discussion, the bottom layer 14 (M2) can be used for "storage". Where M2 is used for storage of the data, the top layer 12 (M1) can be used for reading. If the magnetization direction of M2 is directed to the right, the state can be designated as "0". If the magnetization direction of M2 is directed to the left, the state can be designated as "1". Also, for the purposes of this example, we assume that the storage layer, M2, is magnetically harder than M1 (e.g. has a higher magnetic switching threshold.) Reading may be accomplished by establishing a sufficient magnetic field to place the layer M1 in a known direction but not so strong that it disturbs the orientation of layer M2. By then measuring the resistance (which we define as R(T1)) and then switching M1 to the opposite orientation and measuring the resistance again (giving R(T2)), we can infer the orientation of data storage layer M2. Note that this particular sensing scheme is NDRO (non destructive read-out), it is "self-referencing", and does not require any additional reference or "dummy" bits to operate.

A high resistance is exhibited if the magnetic moments are anti-parallel, while a low resistance is exhibited if the magnetic moments of the two layers are parallel. Using this sequential sensing, and assuming that the first direction of M1 is to the left and the second direction of M1 is to the right, then if R(T1) is greater than R(T2), or that is to say if $\Delta R=(R(T1)-R(T2))$ is greater than 0, then the state is "0". If R(T1) is less than R(T2), that is to say if $\Delta R=(R(T1)-R(T2))$ is less than 0, then the state is "1". In this manner, the measured difference of the resistances is used to determine the state.

It should be noted that NDRO schemes similar to the above are also possible with "spin-valve" or magnetic devices with one magnetic layer "pinned" in one direction. By using the unpinned layer for data storage and by then rotating it only slightly during reading (not enough to actually write the magnetically soft layer) a read scheme similar to that described immediately above can be achieved.

Figure 2B:
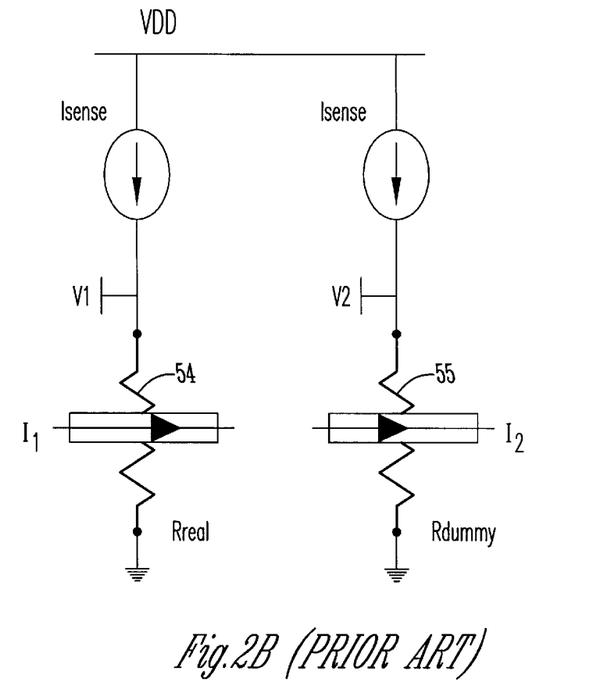

Another prior art sensing method is called dummy sensing. In dummy sensing there is a resistance associated with the bits used for storage designated as the real resistance, Rreal, and a resistance associated with a dummy resistance, Rdummy. See FIG. 2B, diagrammatically illustrating a GMR cell 54 and a separate "dummy" resistor 55 (e.g. another GMR cell or a poly resistor). The dummy resistance is designed to be between the resistance of a bit programmed as a '0' and one programmed as a '1'. Dummy sensing is the comparing of the real resistor value with the dummy resistor value; in other words, $\Delta R=(Rreal-Rdummy)$. The resulting $\Delta R$ is then compared with 0 to determine the state of the GMR element. One configuration for dummy sensing is shown in FIG. 2B.

Despite the advantages of MRAM, including GMR elements, problems remain. These problems are not merely limited to GMR memory types but to other types of magnetic memory, including AMR, SDT, and others, including even movable media memories where data is stored magnetically on films that may move relative to the GMR or tunneling sense element. The problem that has not been fully addressed in the prior art is that the sensing schemes for these types of memories do not take into account unreadable or unstable states, which could, e.g., affect the measurement or determination of $\Delta R$, e.g. whether $\Delta R>0$ or $\Delta R<0$ or some other static value. Unreadable states may be caused by many factors including untimely electrical or magnetic noise that results in an unacceptably small signal level and are not necessarily the result of damaged or defective magnetic memory. Hence, if this situation is detected, simply re-reading the bit or memory location may suffice if a non-destructive read-out scheme has been employed. This situation is sometimes known as a "soft error". Unstable magnetic states can also be caused by numerous factors but generally result from an undesired domain structure developing within the memory bits. This situation will generally not be resolved by re-reading and will probably result in unpredictable bit behavior until the bits are somehow repaired. These factors include surface roughness, noise, process variation, magnetic film inconsistencies, stray magnetic fields, self-heating or other temperature effects, and other factors. It should be noted that several methods exist for possible functional or actual repair of bits with unstable or undesirable domain structures including: (1) use of a redundant bit switched in so as to functionally appear to exist at the address of the affected bit or, (2) the use of large magnitude currents in one or more of the current lines through or in proximity of the bit to force the bit back into the desired single domain structure.

Therefore, it is a primary object, feature, or advantage of the present invention to improve upon the state of the art.

Another object, feature, or advantage of the present invention is to provide an improved memory sensing scheme.

Yet another object, feature, or advantage of the present invention is to provide an improved memory sensing scheme capable for use with magneto-resistive memory, including but not limited to MRAM.

It is a further object, feature, or advantage of the present invention to provide a memory sensing scheme capable of use with most, if not all, types of MRAM.

It is a still further object, feature, or advantage of the present invention to provide a sensing scheme that provides for the detection of unstable states in magnetic memory, including but not limited to MRAM.

Yet another object, feature, or advantage of the present invention is the provision of a sensing scheme that provides for reduced sensing error rate.

A further object, feature, or advantage of the present invention is a sensing scheme that provides for identification of read cycles with inadequate signal size.

A still further object, feature, or advantage of the present invention is the provision of a new sensing method for magnetic memory, including but not limited to MRAM, that is elegant in design.

Yet another object, feature, or advantage of the present invention is the provision of an improved sensing scheme for magnetic memory, including but not limited to MRAM, that is economical.

Other objects, features, or advantages of the present invention will become apparent from the following specification.

BRIEF SUMMARY OF THE INVENTION

The invention includes methods, devices, and systems relating to magnetic memory and the sensing of states in magnetic memory, including the detection and/or identification of unstable states. One aspect of the invention relates to a method of sensing using a windowed sensing scheme and applied to an example of magnetic memory, namely MRAM. According to this method, unstable states may be detected so that a bit may either be electronically repaired or avoided in subsequent memory cycles. This method also allows for reduced sensing error rates by identifying read cycles with inadequate signal size caused by external noise or other effects. According to one aspect of the windowed sensing scheme, a threshold relative to the change in sensed resistance (herein referred to as "delta R" or "$\Delta R$") between first and second read states is defined. In the case of a single MRAM cell, delta R is the difference of resistance from either sequential or dummy sensing, as described previously. Alternatively, some other offset related to effective resistance of the memory element could be sensed, e.g., voltage or current. When the absolute value of $\Delta R$ exceeds the threshold, the bit is considered to be in a stable state, but when the absolute value of $\Delta R$ is less than the threshold, the sensed memory element is considered to be in an unstable state or affected by other parameters.

Detecting that the memory element is in an unstable state, provides a number of options. These include repairing the bit so that $\Delta R$ exceeds the threshold, avoiding writing to the bit in the future, or otherwise identifying the cause of the unstable state or alleviating the effects of the unstable state.

Other aspects of the invention include applying this method to other types of magnetic memory. The "state" of the magnetic memory element or "bit" is read by conventional methods, and that read state is compared to a reference threshold. The reference threshold is selected to insure that the signal that is read to indicate the state of the bit is indicative of a stable magnetic element and, if not, provide an indication from the read that there may be a problem, e.g. a problem with the element or that environmental conditions or other factors affected the element.

Another aspect of the invention involves a circuit for implementing a windowed sensing scheme. This circuit includes a reference generator and a window comparator. Optionally, the circuit may contain a repair circuit that may re-magnetize or re-establish the magnetic domains within the magnetic element so that $\Delta R$ exceeds the threshold. In one aspect of the present invention, the windowed sensing scheme is implemented in a MRAM device such that unstable bits may be detected and optionally repaired.

DETAILED DESCRIPTION OF AN EXEMPLARY EMBODIMENT ACCORDING TO THE INVENTION

One embodiment of the invention relates to a windowed sensing scheme applicable to magnetic memories, including MRAM. The present invention contemplates that numerous types of magnetic memory may be used in accordance with the windowed sensing scheme of the present invention. However, examples contained herein generally use GMR type bits used within an MRAM due to its current popularity and widespread use. The same sensing schemes are applicable to other types of magnetic memory, and this disclosure is in no way limiting to GMR bits or a particular type of magnetic memory, such as MRAM.

A method according to the present invention is shown in one embodiment in FIG. 3. In FIG. 3, in step 32 a resistance threshold RT is defined. According to step 34, this defined threshold RT is compared with the absolute value of $\Delta R$.

When the absolute value of ΔR is greater than the threshold RT, it is determined that a "good state" 36 is present. If the comparison in step 34 results in the absolute value of ΔR being less than the threshold RT, then as shown in step 38, it is determined that the bit is in an unstable or affected state.

The selection of RT is based on the expected relative resistance change for the structure, as well as the environment and need for accuracy or other concerns that may be apparent in a particular application or use. Generally, RT is selected such that RT is slightly less than $R_{Hmin}-R_{Lmax}$, where $R_{Hmin}$ is the lowest high resistance expected of the GMR element and $R_{Lmax}$ is the highest low resistance of the GMR element. Bits usually display a distribution of resistance due to manufacturing and environmental issues and it is anticipated that RT will be adaptive to accommodate likely bit drift, changing power supplies, changing temperature etc. Based upon this method, bits with unstable domains may be detected during reading because these unstable bits will not adhere to the resistance distribution exhibited by normal functioning bits. Furthermore, an improved sensing error rate may be obtained due to the identification of read cycles with an inadequate signal size.

Although the windowed sensing scheme shown is symmetric, as it shows the same absolute RT being used for both of the "good" states (e.g., see FIG. 10 where the positive or +RT, which sets the threshold when ΔR=R1−R2=a positive value, is the same magnitude as the negative or −RT, which sets the threshold when ΔR=R1−R2=a negative value, and thus, positive RT+negative RT=2*RT), the present invention contemplates that different resistance thresholds may also be used. Using a symmetric threshold is merely a convenient embodiment of the invention.

Figure 10:
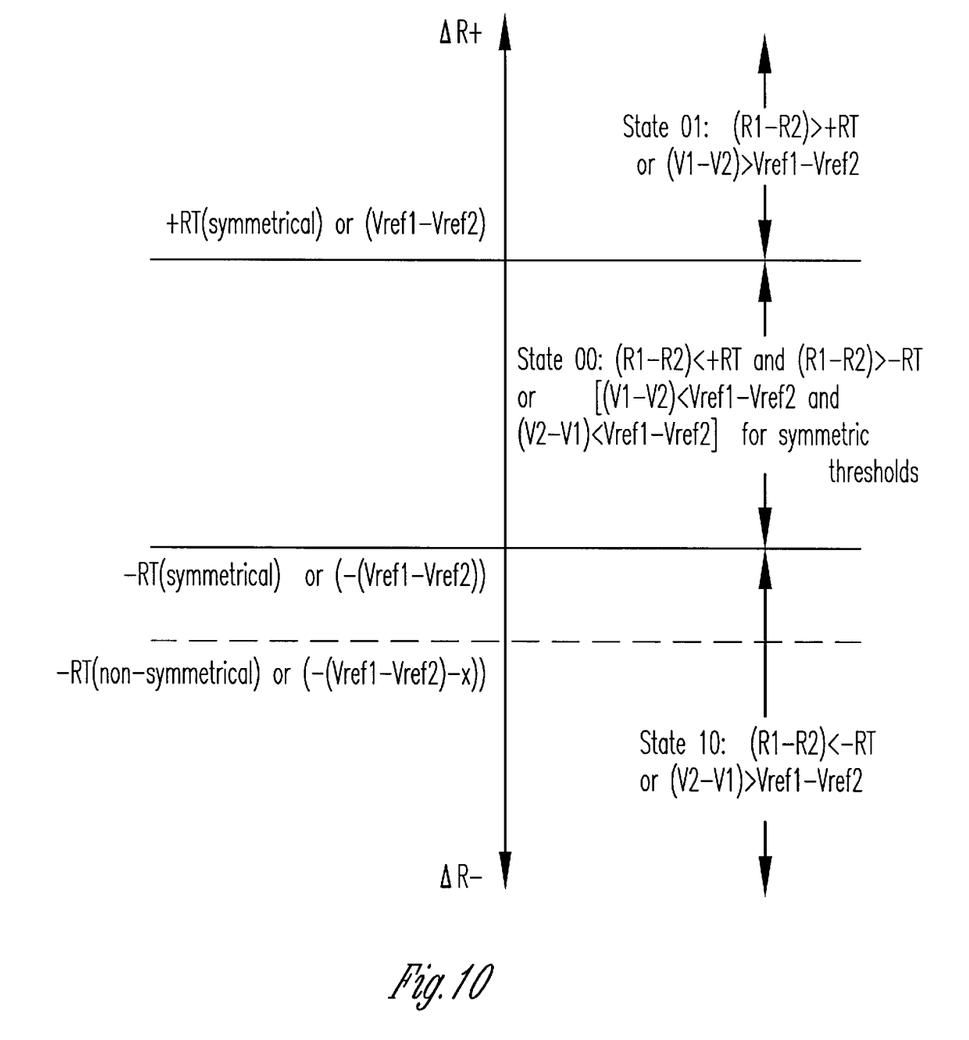
FIG. 10 is a diagram illustrating the windowed sensing scheme according to an embodiment of the present invention, indicating a symmetrical window of the windowed sensing scheme (but showing by a dashed line a possible non-symmetrical window).

Thus, as can be seen in the illustration of FIG. 10, one aspect of the invention utilizes a windowed threshold to define three conditions. The first condition is where resistance measurement R1 is greater than the resistance measurement R2 (e.g. whether by sequential or dummy sensing) and the magnitude of the resistance offset between R1 and R2 is greater than the threshold value RT. This is shown by the top approximate one-third of the graph of FIG. 10 (the portion above the horizontal line labeled +RT).

The second condition is where resistance measurement R1 is less than the resistance measurement R2 (e.g. whether by sequential or dummy sensing) and the magnitude of the resistance offset between R1 and R2 is greater than the threshold value RT. This is shown by the bottom approximate one-third of the graph of FIG. 10 (the portion below the horizontal line labeled −RT.

The third condition is where resistance measurement R1 is either greater than or less than or equal to the resistance measurement R2 (e.g. whether by sequential or dummy sensing) and the magnitude of the resistance offset between R1 and R2 is less than the threshold value RT. This is shown by the middle approximate one-third of the graph of FIG. 10 (the portion between the horizontal lines labeled +RT and −RT). The window is this middle portion (between +RT and −RT). Essentially a magnitude (R1−R2) or (R2−R1) greater than RT indicates the magnetic cell or element is stable. A magnitude (R1−R2) or (R2−R1) less than RT indicates instability or inadequate read signal for some other reason, such as electrical or magnetic noise.

Figure 3A:
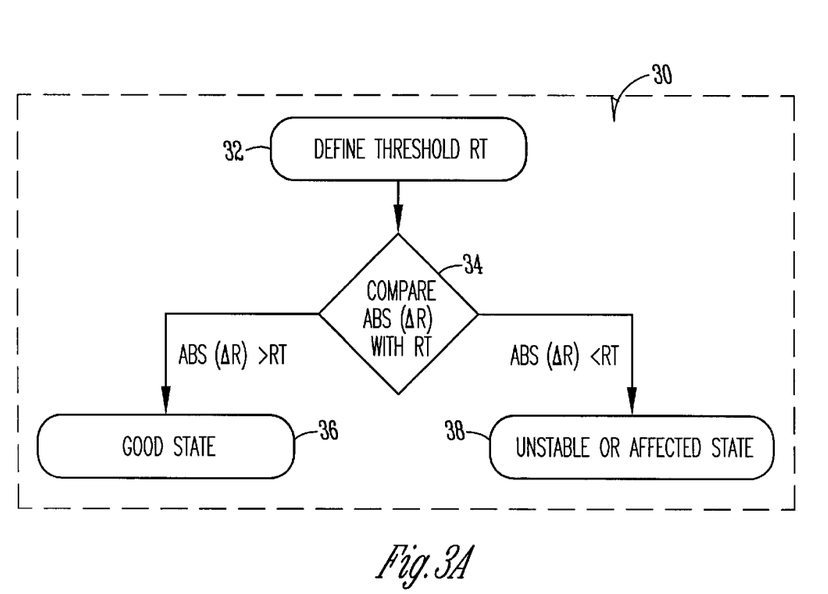
FIG. 3A is a flow diagram of one embodiment of a windowed sensing scheme according to the present invention.
Figure 3B:
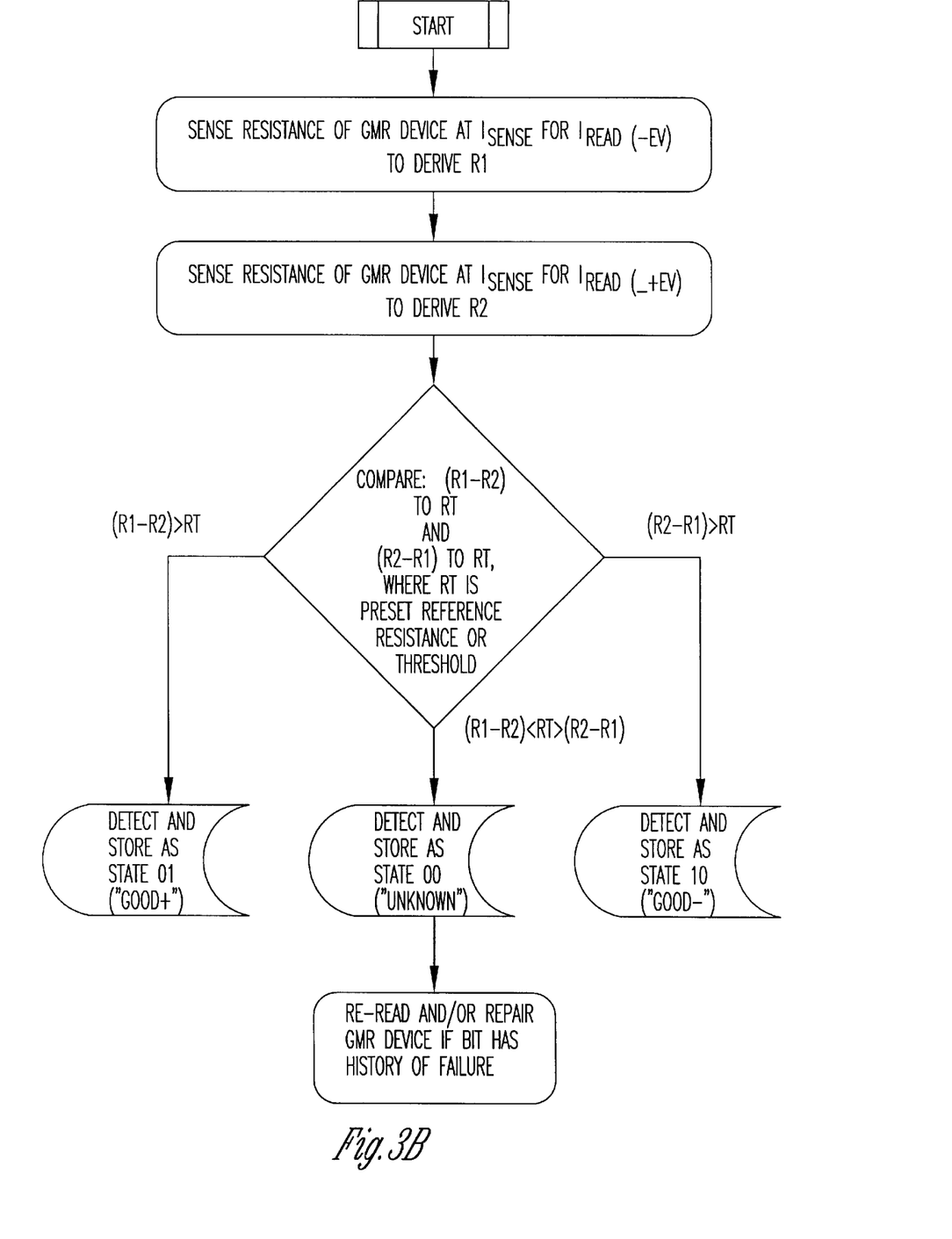
FIG. 3B is a flow diagram similar to FIG. 3A, but illustrating a three-state sensing method according to an embodiment of the present invention.

FIG. 3B illustrates this methodology in flow chart form. As can be appreciated by those skilled in the art, logic can be developed to characterize each of the three states digitally. In the example of FIG. 3B, arbitrarily the first condition is given a two digit binary value "01", the second condition a two digit binary value "10", and the third condition a two digit binary value "00". Control logic (see, e.g., FIG. 4, reference numeral 74) could detect the binary value and take any action deemed appropriate (e.g. repair, read again or ignore).

A non-symmetric window could be created by using two reference generators, one for determining one limit of the window (e.g. +RT), the other for the opposite limit (e.g. −RT). Or, at least in single-ended sensing, the control logic or other circuitry could simply raise or lower the value of +RT or −RT only, to create a lack of symmetry between _+RT and −RT. Other methods are, of course, possible. This is diagrammatically indicated by the alternative lower window limit for −RT shown by the dashed line in FIG. 10. There are a variety of ways to establish an asymmetrical window.

Therefore, by not only comparing R1 to R2 (or to Rdummy), to sense the state of the bit (by comparing R1−R2 (or Rdummy) to zero), the window sensing scheme of FIG. 3 compares ΔR to a threshold RT to sense the magnitude of what will be called the state signal. If the absolute value of the state signal exceeds the threshold RT, the state is considered "good", e.g. the bit is working or stable. If below RT, the bit is considered "unknown" or "bad" e.g. not working or unstable. As can be appreciated, by methods and apparatus well known in the art, or well within the skill of those skilled in the art, the intelligence of the magnitude of the state signal can be advantageously used.

For example, that intelligence can be used to characterize the stability of the bit to allow decisions to be made regarding how to treat the bit in succeeding memory cycles and whether to try and simply re-read the bit in the event the problem was caused by some form of transient noise. Should this second reading also prove indecisive, one decision could be to attempt to "repair" the bit; e.g. electronically repairing or resetting the bit or refreshing or regenerating the magnetic moment of the bit. Another decision could be to ignore or pass over the bit during reading, or not writing to the bit during writing.

Another example would be to keep track of or monitor the bit during memory cycles. If the bit shows signs of instability, even though it in fact is functioning properly, the sensing scheme may be able to predict a future stability problem and allow repair or other handling before it is a problem.

The windowed sensing scheme can be implemented in many ways. As discussed previously, FIG. 10 illustrates three states in this example; (R1−R2)>+RT, +RT>(R1−R2)>−RT, and (R1−R2)<−RT; i.e. "good+", "unknown", and "good−". Essentially this involves measuring R1 and R2, and comparing ABS (R1−R2) to ABS(RT), whether directly or indirectly. One is described, as follows.

The comparison of resistance to obtain ΔR, for purposes of the windowed scheme, may be performed indirectly (e.g. through Ohm's law) using a comparison of voltages. This voltage comparison can be done applying the same current, such that any difference in voltages is a direct function of the resistance. The present invention includes devices that implement this windowed sensing scheme.

FIGS. 1–3 show a high level illustration of the method relative to a single GMR device. But as previously described, even a simple pinned GMR device with one rotating magnetic layer can have three states in this method, namely (1) ΔR is positive (Rl>R2) and its value exceeds RT; (2) ΔR is positive (R1>R2) but its value does not exceed RT or it is negative (R1<R2) but its value is not more negative than –RT; or (3) ΔR is negative (R1<R2) and its value is not more negative than –RT. These three "states" are illustrated in FIG. 3B and FIG. 10.

Figure 4:
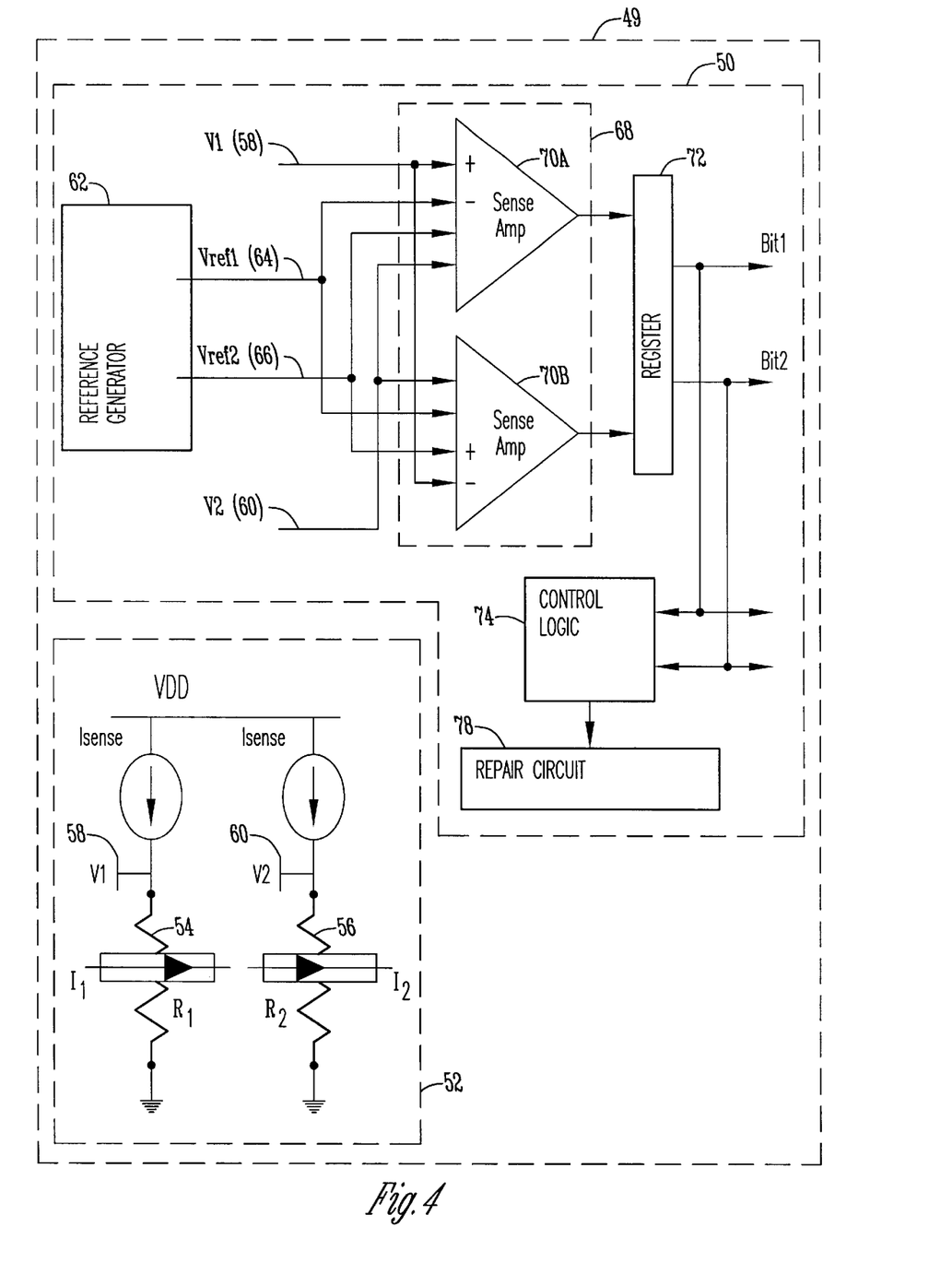
FIG. 4 is a circuit diagram of one embodiment of a sensing circuit according to the present invention.

FIG. 4 illustrates one specific embodiment of a GMR sensing circuit 49 according to a symmetric window sensing scheme. Circuit 49 contains two sense-amplifiers that compare the input signals 58 and 60 with input references 64 and 66. In FIG. 4, the sensing circuit 49 includes circuit 50 and circuit 52. Circuit 52 in the lower left-hand portion of FIG. 4 is intended to illustrate diagrammatically how voltages directly related to values R1 and R2 for a single GMR resistor (the magnetic memory element holding the "0" or "1" bit) are derived. Circuit 52 shows R1 (see reference numeral 54) and R2 (see reference numeral 56) diagrammatically to indicate generically a "sensing" or "reading" of the state of a single GMR device or memory element, whether by sequential sensing or dummy sensing, even though two GMR devices are shown. Thus, V1 and V2 could be the V1 and V2 illustrated in FIG. 2A or 2B. Circuit 52 also could be deemed to diagrammatically indicate simultaneous differential sensing, however, if a single GMR bit is voltage sensed from both sides of the resistor or if 2 GMR bits are actually used to store information for a single data bit but where the bits are written with complementary data.

Thus, circuit 52 illustrates the principle that if read sequentially or by dummy or differential sensing, two resistance values R1 and R2 are derived, which can be compared to then derive ΔR. In other words, with a pinned GMR device, R1 is associated with one orientation of the layers of magnetic materials (see FIG. 1). Circuit 52 also can indicate a R2 (see reference numeral 56) which is associated with the resistance of a different orientation of magnetic layers(see FIG. 1).

There is also a current and voltage associated with each of these resistances R1 and R2. A voltage V1 may be measured at node 58 and a voltage V2 may be measured at node 60 of FIG. 4. The comparison of the resistance R1 and R2 according to one method of the present invention is achieved by comparing voltages V1 and V2 in the circuit of FIG. 4.

V1 in the circuit diagram 52 represents V1=R1×I for sequential sensing and V1=Rreal×I for dummy sensing. Similarly, V2=R2×I for sequential sensing and V2=Rdummy×I for the dummy sensing scheme.

The main circuit 50 includes a reference generator 62. The reference generator 62 includes a Vref1 output 64 and a Vref2 output 66. The reference voltage is Vref1–Vref2. In order to keep the symmetry of the circuit, the reference voltage is also achieved by using Vref1–Vref2, although in principle, one of the reference voltages could in fact be zero. The reference voltage is Vref1–Vref2=I×RT. RT can be generated in a number of ways, and can be selected based on a number of factors, some of which have been described earlier.

A window comparator 68 is shown. The window comparator 68 includes sense amplifier 70A and sense amplifier 70B. Each sense amplifier may be implemented as a fully differential CMOS comparator, either having continuous time differential inputs or as a simpler circuit performing the comparisons sequentially. Each sense amplifier may have circuitry allowing offset cancellation for improved performance. The inputs to the window comparator are V1 and V2, as illustrated in circuit 52, and Vref1 and Vref2 from reference generator 62. In the embodiment of FIG. 4, each of those inputs are split into each sense amplifier 70A and 70B. The two sense amps 70A and 70B form the windowed comparator. Sense amplifier 70A produces an output based upon if (V1–V2)>(Vref1–Vref2) and sense amplifier 70B produces an output based upon if (V2–V1)>(Vref1–Vref2). In a simple use of this circuit, sense amplifier 70A might produce an output "1" if the input signal was ambiguously a "1" and sense amplifier 70B might produce an output "1" if the input signal was unambiguously a "0". If neither sense amplifier produced a "1" then the input signal would be deemed inadequate to make a determination. A variety of comparators and windowed comparators are possible. Some examples are suggested at B. Razavi and B. A. Wooley, "Design Techniques for High Speed, High Resolution Comparators", *IEEE Journal of Solid-State Circuits*, Vol. 27, No. 12, December 1992, which is incorporated by reference herein.

The window comparator 68 is electrically connected to a register 72 to store the sensed state of the memory element. Data from this register may then be used to determine if the bit being read has produced an adequate signal, and if not, what actions are to be taken. As given in the example of FIG. 3B, the output of sense amps 70A and 70B might be as follows:

| STATE | OUTPUT OF 70B | OUTPUT OF 70A |
|---|---|---|
| (V1-V2) > (Vref1-Vref2) | 0 | 1 |
| (V1-V2) < (Vref1-Vref2) and (V2-V1) < (Vref1-Vref2) | 0 | 0 |
| (V2-V1) > (Vref1-Vref2) | 1 | 0 |

From this, logic circuit 74 could detect a potentially unstable condition for the MRAM bit (by detecting binary number "00").

Figure 5:
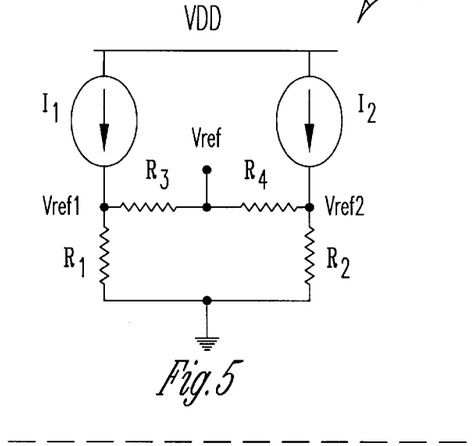
FIG. 5 is a more detailed circuit schematic of one embodiment of the reference generator of FIG. 4.

The reference generator 62 may be implemented as shown in the exemplary embodiment of FIG. 5. Vref1 and Vref2 as shown in FIG. 5 are functions of the value of R1, R2, R3 and R4 as well as I1 and I2.

In one embodiment, R1 and R2 may be GMR bits functionally or actually identical to the memory bits to be sensed but where R1 has been programmed in one state (e.g. a "1") and R2 has been programmed into the other state (e.g. a "0"). R3 and R4 can be selected to achieve a desired RT for the circuit 49, as Vref1–Vref2=VT and VT=I*RT or RT=VT/I. Thus, dependent on I1 and I2, R3 and R4 are selected to provide Vref1–Vref2, which creates an VT related to RT desired for the memory element to which the sensing circuit is applied.

In one embodiment, R3 and R4 are the same (e.g. 1 K ohm). R3 and R4 can be a magnetoresistive or a poly resistor or even a switched capacitor emulating a resistor.

In the embodiment of FIG. 5, it can be shown how Vref1 and Vref2 can be adjusted to achieve the reference voltage desired:

Begin by deriving the equations for Vref1 and Vref2.

$I1=I2=I=1$ mA;

$I1*R1=V_H$;

$I2*R2=V_L$;

$V1=Vref1$;

$V2=Vref2$;

Assume the current flowing through R3 and R4 is I3, and that $R2=R3=R4=R_L$;

$$V1-Vref=I3*R3$$

$$Vref-V2=I3*R4 \rightarrow Vref=(V1+V2)/2$$

$$V1-V2=I3*(R3+R4)$$

$$V1=(I1-I3)*R1=V_H-I3*R1$$

$$V2=(I2+I3)*R2=V_L+I3*R2$$

Thus, $$V1-V2=V_H-V_L-I3*(R1+R2)$$

$$I3=(V_H-V_L)/(R1+R2+R3+R4)$$

The result for Vref1 and Vref2 is:

$$Vref1=V_H-(V_H-V_L)*R1/(R1+R2+R3+R4)$$

$$Vref2=V_L+(V_H-V_L)*R2/(R1+R2+R3+R4)$$

From the above equation, it can be seen that Vref1 and Vref2 are functions of the value of R3 and R4.

As an example, if, using the above equations, R3=R4=600 Ohms, and R1=102 Ohms and R2=100 Ohms, ΔR would equal 2 Ohms, and $\Delta R/R_{min}$=2%; but further:

$$Vref1=V_H-(V_H-V_L)*R1/(R1+R2+R3+R4)=101.9 \text{ mV}$$

$$Vref2=V_L+(V_H-V_L)*R2/(R1+R2+R3+R4)=100.1 \text{ mV}$$

Figure 6:
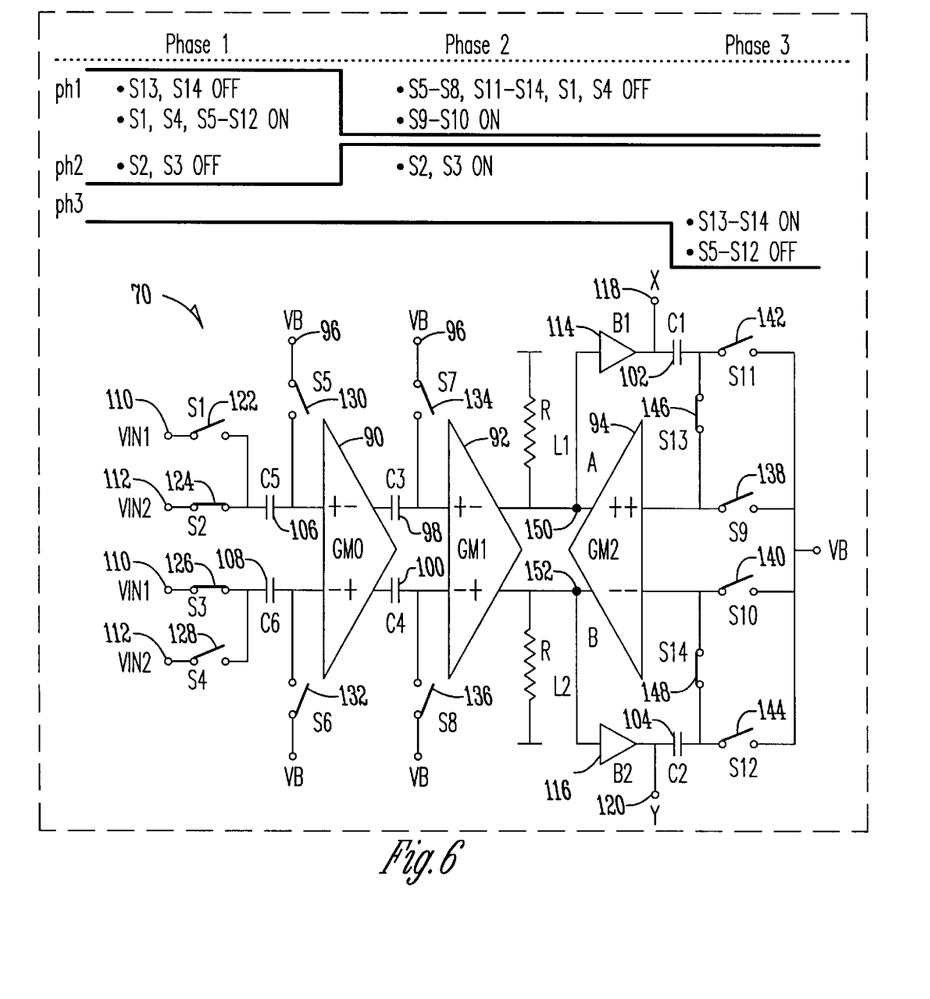
FIG. 6 is a more detailed circuit diagram of one embodiment of a sensing amplifier useable with the window comparator of FIG. 4.

The present invention contemplates other types of reference generation methods, including, but not limited to, resistor strings. Adjustment of the current input would produce a desired voltage output. A resistor string composed of all "high" resistor bits will generate $V_H$ (relative the above equations), and a resistor string composed of all "low" resistor bits will generate $V_L$. One simply chooses the appropriate number of "low" and "high" bits to generate the desired voltage. Fractional values between "high" and "low" values may be achieved by parallel resistors or parallel strings. Such resistor strings are well known in the art. An embodiment of a sensing amp 70 (either 70A or 70B) is shown in FIG. 6 in the form of a simplified block diagram. Sensing amp 70 includes three transconductance amplifiers designated by reference numerals 90 (Gm0), 92 (Gm1), and 94 (Gm2). Transconductance amplifiers 90 (Gm0) and 92 (Gm1) are used for pre-amplification. In a calibration mode (to initialize the amp 70), inputs of transconductance amplifiers 90 (Gm0), 92 (Gm1), and 94 (Gm2) are connected to a bias voltage 96 (VB). The offsets of transconductance amplifier 90 (Gm0) are amplified and stored on capacitors 98 (C3) and 100 (C4). The offsets of transconductance amplifiers 92 (Gm1) and 94 (Gm2) are amplified and stored on capacitors 102 (C1) and 104 (C2). The voltages preceding the capacitors 106 (C5) and 108 (C6) are voltages 110 (Vin1) and 112 (Vin2), respectively. In a comparison mode (when used to compare inputs to the window comparator), the voltages preceding the capacitors 106 (C5) and 108 (C6) are changed to the voltages 112 (Vin2) and 110 (Vin1), respectively (from V1 and V2 of FIG. 4). The two input voltages of preamplifier 90 (Gm0) are changed to (VB+Vin2−Vin1) and (VB+Vin1−Vin2), respectively. The difference between these two input voltages is sensed. This voltage is amplified by transconductance amplifiers 90 (Gm0) and 92 (Gm1) to establish an imbalance at nodes 150 (A) and 152 (B), initiating a fast regeneration around transconductance amplifier 94 (Gm2).

The offset-cancellation of this circuit 68 can be viewed as output offset storage applied to transconductance amplifiers 90 (Gm0), 92 (Gm1) and 94 (Gm2), resulting in significant cancellation of their offsets. This topology utilizes the offset-cancelled amplifier 94 (Gm2) for regeneration. Using regeneration in this manner allows for less sensitivity to variances in the transconductance amplifiers and higher noise immunity.

A regenerative circuit is used to accomplish relatively high comparison speed. Offset cancellation is used to deal with input-referred offset and noise.

In this circuit, buffers 114 (B1) and 116 (B2) isolate the output nodes 118 (X) and 120 (Y) from the feedback capacitors 102 (C1) and 104 (C2), while switches 142, 144, 146, 148 (S11–S14) control the feedback loop. Regeneration begins only after the input voltage has been sensed and amplified. It should be noted that the offsets of buffers 114 (B1) and 116 (B2) are also stored on capacitors 102 (C1) and 104 (C2).

Thus, the sensing amp 70 of FIG. 6 works, after calibration, in the pair 70A and 70B shown in FIG. 4, to each (a) receive a set of inputs V1, Vref1, Vref2, and V2, (b) compare them (V1−V2 and Vref1−Vref2 in sensing amp 70A, and V2−V1 and Vref1−Vref2 in sensing amp 70B), (c) to determine the positive and negative magnitudes of the state signal of the memory element in relation to the positive and negative magnitudes of the reference threshold. See FIG. 10.

This would, therefore, indicate which of the three states of FIG. 10 the memory element is in, and thus, of course, also provide the necessary information to determine whether the absolute value of the state signal exceeds the reference threshold (by knowing if the state signal is outside or inside the window defined by +RT and −RT) (see FIG. 10).

In this manner, the two sensing amps 70A and 70B of window comparator are used to determine whether the sensed voltage (and corresponding resistance) indicates that the state sensed is "good" or not. If the state sensed is outside of the threshold of the "good" state (i.e. outside the window between +RT and −RT), then appropriate action can be taken. This can include re-magnetizing the GMR element in the proper manner so that a "good" state is subsequently sensed. This can be accomplished with a repair or restoration circuit 78, see FIG. 4, where such a circuit is diagrammatically depicted. Such circuits are well known in the art and the details are not needed here. Control circuit 74 (FIG. 4) could control the operation of sensing circuit 49. Such a circuit is well within the skill of those skilled in the art.

Alternatively, the particular GMR element can be avoided in future storage operations, or other appropriate action may be taken such as may be suggested by a particular environment or application.

An MRAM cell using the windowed sensing scheme of the present invention has been successfully implemented. A CMOS implementation of a sense amp 70 is shown in FIGS. 7, 8, and 9.

Figure 7:
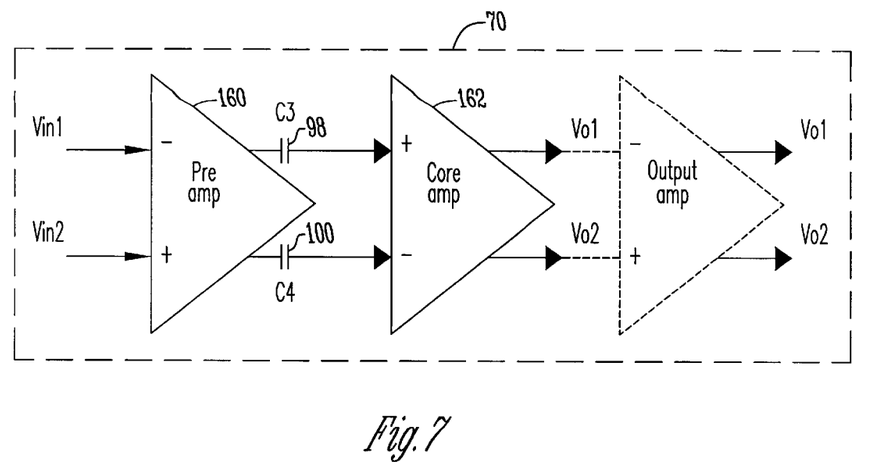
FIG. 7 is a top schematic of the sensing amp of FIG. 6.

FIG. 7 provides a top schematic of the circuit of an exemplary sense amp 70A or B that can be used in the window comparator 68. Sense amplifier 70 of FIG. 7 has a preamplifier 160, a core amplifier 162 and potentially an output amplifier. The preamp constitutes amplifier Gm0 of FIG. 6 and is implemented as a single differential pair, shown in FIG. 8, with a gain of approximately 5.

Figure 8:
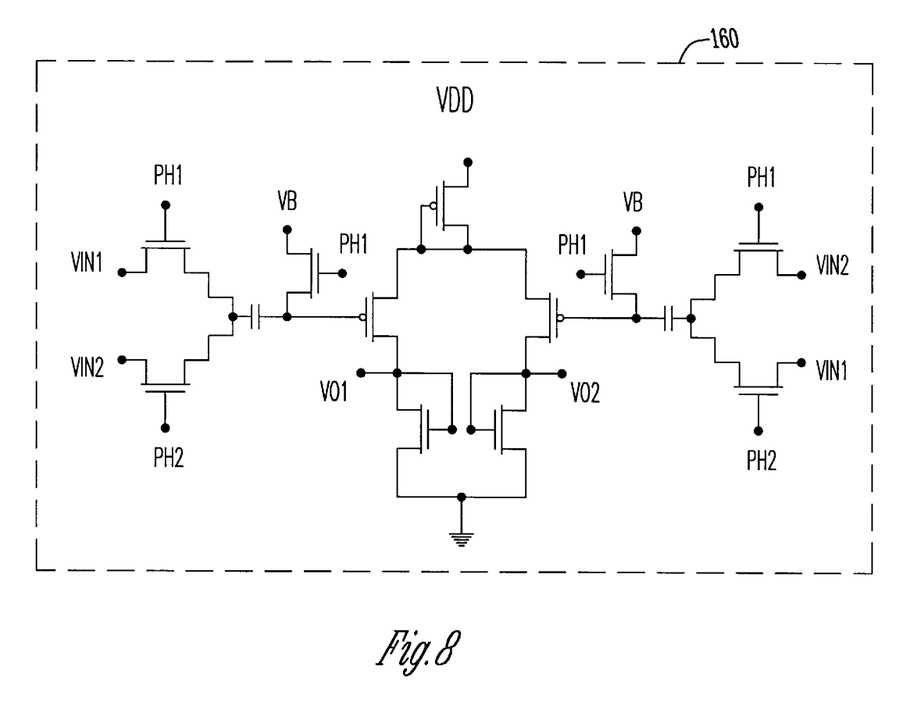
FIG. 8 is a more detailed schematic of a preamplifier such as diagrammed at FIG. 7.
Figure 9:
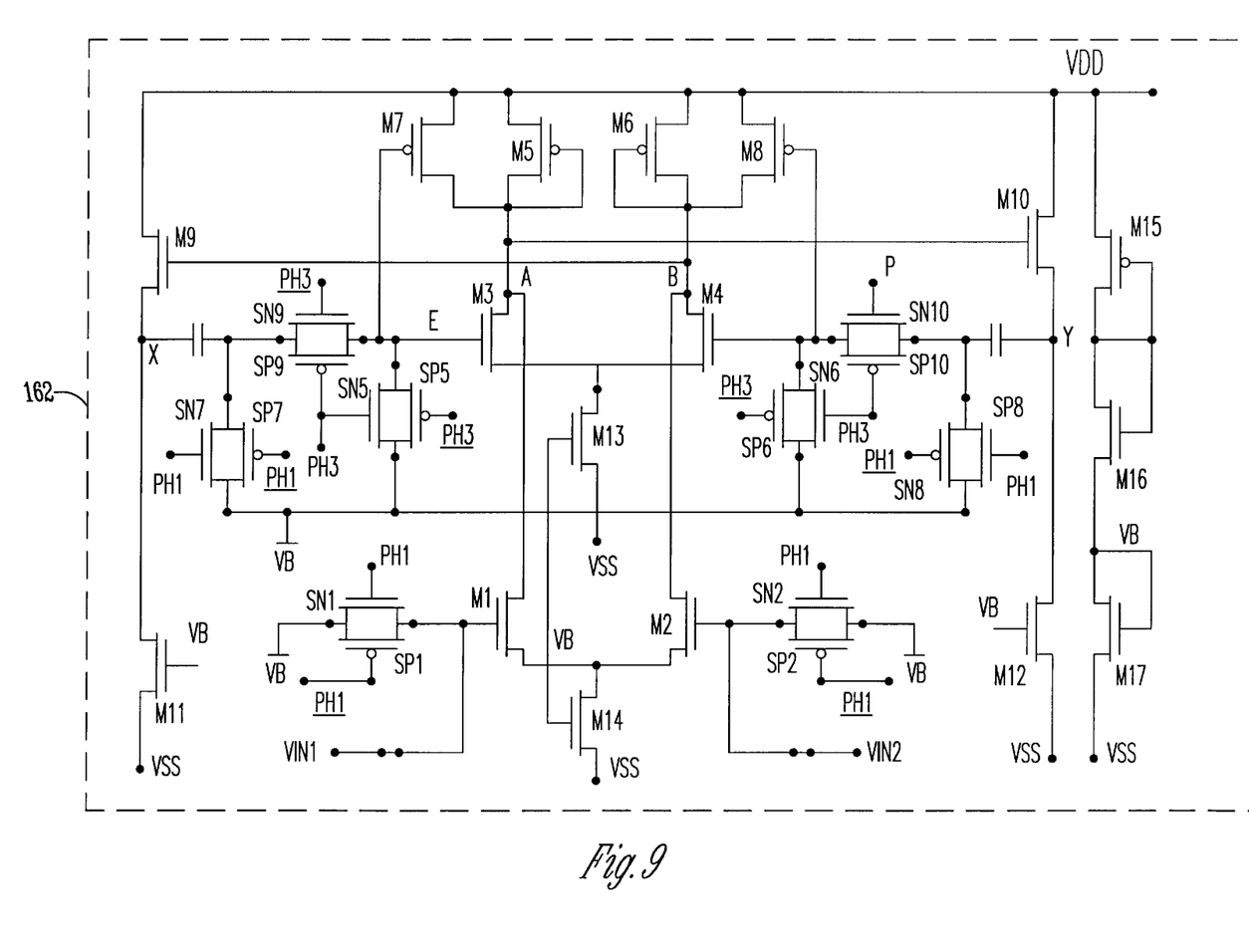
FIG. 9 is a schematic of a core amplifier or comparator such as diagrammed at FIG. 7.

FIG. 8 provides a circuit schematic for one differential preamplifier 160 that may be used in the present invention. FIG. 9 provides the circuit schematic for one core comparator 162 that may be used in the present invention.

In the circuit of FIG. 8, the function of the preamplifier preceding the series storage capacitors, C3 and C4 is to reduce the comparator input capacitance. And because the effect of charge injection mismatch from S13 and S14 is now divided by the amplifier gain, C3 and C4 can use smaller values.

In the circuit of FIG. 9, after analysis, the resulting input offset is $$V_{os} = \Delta Q/C((g_{m34}+g_{m78})/g_{m12}$$

where $\Delta Q$ is the channel-charge mismatch of S9 (SP9 and SN9) and S10 (SP10 and SN10) when they are on, C=C1= C2, and $g_{m34}$, $g_{m78}$, and $g_{m12}$ are the transconductance of differential pairs M3-M4, M7-M8, and M1-M2, respectively. As a compromise among the tradeoffs, C=0.5 pF and $g_{m12}$=1.34($g_{m34}$+$g_{m78}$) were used in the immediately preceding equation, which indicates that, in contrast to Output offset storage end Input Offset Storage configurations, the circuit imposes no constraints between the preamplifier voltage gain and the residual offset, thus allowing a better optimization of the load devices for speed and input range. The comparator generates a differential output voltage of approximately 0.8 V. A non-regenerative amplifier could be used to further amplify the output voltage to rail to rail voltage (see amplifier in dashed lines in FIG. 7).

In addition to the implementation, simulation of the sense amplifier using windowed sensing has been performed and has further validated the design. The circuit used clock phases Ph1, Ph2, and Ph3 in the core comparator (see FIG. 9). The circuit switches from the calibration to the tracking mode at t=12 Ns and begins regeneration at t=24 ns. The comparator is reset at t=40 ns. It is operated at 25 MHz.

The performance of the window comparator in simulation, at approximately 25 degrees Centigrade, was as follows:

| | |
|---|---|
| Window range | 2 mV |
| Speed | 20–30 MHz |
| Resolution | 100 μV (approx.) |
| Power supply | 3.3 V |
| Power dissipation | 4.5 mV |

The reference generator provided 100.1 mV, but simulations indicated that the proper state could be detected for all possible input values, within the range (Vin1−Vin2<=(ABS (Vref1−Vref2))−400 μV). It is believed this would be true for a 200 μV as well as 400 μV. When the circuit temperature increases, Vin1, Vin2, Vref1 and Vref2 will increase, but ABS (Vref1−Vref2) and ABS(Vin1−Vin2) will decrease.

OPTIONS AND ALTERNATIVES

It will be appreciated that the present invention can take many forms and embodiments. The true essence and spirit of this invention are defined in the appended claims, and it is not intended that the embodiment of the invention presented herein should limit the scope thereof. Variations obvious to one skilled in the art will be included within the invention defined by the claims.

For example, one exemplary embodiment applies a method and apparatus according to the invention to an MRAM cell; with a GMR resistor as the magnetic memory element or bit. As previously stated, a variety of GMR or magnetoresistive elements are known or contemplated in the art, and are included within the scope of this invention. But further, other types of magnetic memory are also included. An example would be various types of magnetic hard drives or discs. In a sense, the invention therefore also applies to what might be called "moving magnetic memory", where the magnetic material to which at least two resistive states can be and/or read, moves relative to a read and/or write device or head; or vise versa; or both move relative to one another.

Furthermore, other implementations of this windowed comparator function are also contemplated by this invention, including implementing one or more steps digitally. In one implementation, an analog-to-digital conversion of the signal read from the MRAM bit is performed. The analog resistance of the signal can be read and converted to a digital value, then digital comparisons of the resistance are performed. For example, the method according to FIG. 3 could be digitally implemented. In this manner, the steps of the windowing scheme of the present invention can be implemented in digital as well as analog form. Applying the windowing scheme digitally provides the opportunity for additional variations in the windowing scheme as may be appropriate in a particular environment or application and without needing to redesign the circuit for each change in the windowing scheme. Therefore, the present invention includes these as well as other analog and digital implementations.

Extension of the sensing method or apparatus to MRAM of a plurality of coordinated GMR resistor memory bits is within the skill of those skilled in the art. Sensing circuits such as illustrated and described herein could be distributed and utilized to sense a plurality of GMR resistors sequentially by appropriate control logic. Preferably, for improved speed of the memory, a sensing circuit such as FIG. 4 would be used for as few GMR resistors as practical, perhaps one sensing circuit per row or column of memory elements.

Application of the method and apparatus according to the invention to moving memory is within the skill of those skilled in the art. The signal conventionally used to read a bit from such memory would be compared to a preset or adaptive threshold to determine if the signal strength is indicative of a stable bit or not.

Methods, devices, and systems for MRAM sensing have now been disclosed. Additional disclosure is contained in the provisional application serial No. 60/308,708 incorporated by reference herein. The invention includes variations in the number of states detected, the thresholds used, the circuits used, the type of reference generator used, the type of sense amplifier used, and the functionality of the repair circuit. These and other variations and modifications are within the spirit and scope of the invention.

A partially or fully digital example is as follows. An A/D converter could convert, as a sensed signal comes in, the magnitude of the sensed signal and assign it a number based on magnitude (e.g. assigned from a range of numbers 0–7). The signal could be assumed "good" and the bit stable if the assigned number was outside a windowed threshold (e.g. a value >6 could be assigned a logical "1" and a value <3 could be assigned a logic "0"). Thus, three states "10", "01", and "00", as described regarding FIG. 3B, could be sensed. Furthermore, using this "digital" method could allow easy setting of threshold limits, including setting different +RT and −RT, e.g., for compensation of some condition or parameter.

The embodiments discussed were implemented in a −3.3 V process, 0.35 μM conventional n-well CMOS process, but is applicable to other implementations.

As previously discussed, the reference threshold could be a resistance value, predetermined or adaptive. It could also be related to effective resistance by using voltage or current.

The reference threshold could be based on the performance of a "good" bit (e.g. a magnetic bit that is assumed or determined to be functioning properly and stable), such that the signal which can be measured or sensed to determine its logic state is relatively large in magnitude. RT would be selected to be something less in magnitude, but preferably relatively close in magnitude. Usually RT would be selected to be slightly smaller than the magnitude of sensed signal of the bit under normal conditions but statistically unlikely to be read as an unstable bit if it was in fact operating correctly. Additionally, RT could be adaptive in the sense it would dynamically change with conditions affecting the bit. For example, RT could be adjustability set on the fly with reference to some parameter. One example would be to measure the signal sensed from similar bits on-chip with the bit at issue, and then subtract some of the magnitude of that signal to provide a dynamic adaptive RT. This is in a sense like what is employed in DRAMs. One or more dummy bits that output a value between 1 and 0 could be used, such that whenever a bit at issue is read or sensed, that value could be compared to one or more dummy bit sensed values. If the dummy bits are relatively close to the bit at issue, they likely would experience the same conditions as the bit at issue, and their sensed signal could rise or fall in magnitude over time. By using such an arrangement, RT would follow that rising and falling, and thus be adaptive to the conditions, and be useful as a reference threshold for the bit at issue. This is important because sometimes conditions could affect a bit enough that the condition could overwhelm the sensing of the bit or predominate over its normal sensed magnitude. Adaptive, adjustable setting of RT would eliminate or minimize problems in these situations. This technique uses principles of what are often called replica circuits.

For a non-symmetrical window, such as previously described, two reference voltages or values could be generated, one for +RT and one for −RT. Other methods are possible.

A sensing circuit according to the invention could be implemented for each magnetic bit, or more likely, one for a plurality of magnetic bits (e.g. one per row, one per column, or several sensing circuits spaced along each.row or column). By electronic switching or other methods, a sensing circuit can access and sense each bit and, if needed, regenerate bits. Like DRAM, one or a few sensing circuits could be distributed in the middle of each row of bits. Optionally, part of the circuit could exist near the bits and other parts of the circuit could be located away from the bits. For example, larger sensing amplifiers could be placed farther away from the bits where there is more room or to reduce heating effect. Finally, mechanical selection can also be employed instead of or in addition to electronic selection for memories employing some form of movable media or movable sensing and possibly writing circuitry.

One additional aspect of this invention is its utility in performing multiple bit per memory element sensing where the magnetic moment of more than one layer within a GMR or multi-layer magnetic element is to be determined. This occurs in "pseudo spin-valve" memory types where, for example, in a two-layer film, potentially four magnetic alignments are possible. Successfully reading and writing all possible alignments doubles the bit density over conventional "pinned" bits with only one rotating magnetic layer and hence are potentially advantageous in very dense memories. Memory read schemes for this type of bit taking advantage of all possible magnetic film alignments have been described in for example, R. Zhang, M. Hassoun, W. Black, Jr., B. Das, K. Wong, "Demonstration of a Four State Sensing Scheme for a Single Pseudo-Spin Valve GMR Bit", *IEEE Transactions on Magnetics*, September 1999, incorporated by reference herein. Using the techniques of this invention, potential magnetic instability in any of the layers of such a multi-layer magnetic bit structure could be determined.

What is claimed is:

1. A method of sensing an on-chip magnetic memory element having at least two states comprising:
   (a) sensing the state of the memory element;
   (b) determining signal size of the sensed state;
   (c) comparing signal size to a reference value;
   (d) characterizing stability or instability of the memory element by the comparison.

2. The method of claim 1 wherein the memory element is a part of high density, nonvolatile magnetic memory.

3. The method of claim 2 wherein the wherein the magnetic memory comprises magnetoresistive random access memory (MRAM).

4. The method of claim 3 wherein the MRAM comprises a GMR memory device.

5. The method of claim 3 wherein the MRAM comprises a tunneling memory device.

6. The method of claim 5 wherein the MRAM comprises a memory device with one pinned magnetic layer.

7. The method of claim 1 wherein the sensing of state of the memory element is by determining delta R, the difference in effective resistance of the memory element relative to either of two resistive states, where the resistive states are either related to its magnetization or are between a resistive state related to its magnetization and a reference value.

8. The method of claim 7 wherein delta R is determined by sequential sensing.

9. The method of claim 7 wherein the delta R is determined by dummy sensing.

10. The method of claim 7 wherein the signal size is a direct function of delta R.

11. The method of claim 1 wherein the reference value comprises a reference threshold RT.

12. The method of claim 11 wherein RT is dependent on environmental and operational factors.

13. The method of claim 12 wherein the magnitude of RT is selected to be a function of the difference between a normal high resistive state and a normal low resistance state for the memory element.

14. The method of claim 12 wherein RT is adaptive to varying conditions associated with the memory element.

15. The method of claim 14 wherein the varying conditions include one or more of a changes in temperature, a change in power, or influence of an external magnetic field.

16. The method of claim 12 wherein the comparison values are embodied in resistances, voltages, or currents proportional to delta R and RT.

17. The method of claim 12 wherein the step of characterizing comprises (a) designating the memory element as non-erroneous if the absolute value of (delta R)>RT.

18. The method of claim 12 wherein the step of characterizing comprises (b) designating the memory as erroneous or affected if absolute value of (delta R)<RT.

19. The method of claim 17 wherein non-erroneous is assumed to be a stable memory element.

20. The method of claim 18 wherein erroneous is assumed to be an unstable or affected memory element.

21. The method of claim 20 further comprising fixing the memory element if assumed unstable or affected.

22. The method of claim 21 wherein fixing the bit comprises electrically rewriting the state of the memory element.

23. The method of claim 20 further comprising ignoring or not writing to the memory element if assumed unstable or affected.

24. A method of determining stability of a magnetic memory element having at least two states comprising:
   (a) deriving delta R for the element, wherein delta R comprises magnitude of difference related to effective resistance for the element between either two resistive states of the element or between a resistive state of the element and a reference;
   (b) comparing delta R to a threshold value to differentiate three ranges of the memory element;
   (c) assuming the element is stable if absolute value of (delta R) is greater than the threshold value.

25. The method of claim 24 wherein the element is an MRAM bit.

26. The method of claim 25 wherein the MRAM bit is a GMR or tunneling device.

27. The method of claim 24 wherein the threshold value is generally smaller than the delta R of a typical bit.

28. The method of claim 24 further comprising using a windowed comparison method to compare a windowed threshold to delta R.

29. The method of claim 28 wherein the windowed comparison based upon:
   (a) measuring a voltage V1 derived related to an effective resistance value R1 based on a resistive state of the element;
   (b) measuring a voltage V2 derived related to an effective resistance value R2 based upon one of another resistive state of the element or a reference resistance;
   (c) generating a reference voltage;
   (d) comparing (V1−V2) to the reference voltage;
   (e) comparing (V2−V1) to the reference voltage;
   (f) considering the element to be stable if either
      (1) (V1−V2) is greater than the reference voltage, or
      (2) (V2−V1) is greater than the reference voltage;
   (g) considering the element to be unstable if (V1−V2) is less than the reference voltage and (V2−V1) is less than the reference voltage.

30. An apparatus for sensing the stability and state of a magnetic memory element having at least two logic states comprising:
   (a) a reference generator adapted to output a reference voltage Vref related to a threshold value RT;
   (b) a windowed comparator having inputs for comparing
      (1) first and second voltages V1 and V2 related to two resistance values R1 and R2 from either sequential or dummy sensing of the memory element;
      (2) the reference voltage Vref; and adapted to output a voltage in one of three ranges around the nominal value of the memory element;
   (c) so that said output voltage can be used to characterize the state of the memory element as one of:
      (1) a first range indicating a stable logic "0";
      (2) a second range indicating a stable logic "1";
      (3) a third range intermediate said first and second ranges indicating no stable logic state.

31. The apparatus of claim 30 wherein the memory is an MRAM.

32. The apparatus of claim 31 wherein the MRAM employs GMR or tunneling devices as storage elements.

33. The apparatus of claim 30 wherein the reference generator outputs two reference voltages related to limits of a threshold window.

34. The apparatus of claim 33 wherein the two limits are symmetric about a value.

35. The apparatus of claim 33 wherein the two limits are asymmetric about a value.

36. The apparatus of claim 30 further comprising a register in operative connection to the windowed comparator.

37. The apparatus of claim 36 further comprising a repair circuit operatively connected to the register.

38. A method of sensing a magnetic memory element having at least two states comprising:
   (e) sensing the state of the memory element;
   (f) determining signal size of the sensed state;
   (g) comparing signal size to a reference value;
   (h) characterizing stability or instability of the memory element by the comparison.

39. The method of claim 38 wherein the magnetic memory elements are moveable relative to a read and/or write component for the memory element.

40. The method of claim 39 wherein the magnetic element is embodied in a disk drive.

41. The method of claim 39 wherein the magnetic element is embodied in a moveable read and/or write head.

42. The method of claim 39 wherein the magnetic is an MRAM device.

43. An apparatus for sensing the state of a magnetic memory element comprising:
   (a) a reference generator to generate a reference voltage Vref;
   (b) a component to measure a voltage V1 related to a resistive state of the memory element;
   (c) a component to measure a voltage V2 related to either another resistive state of the memory element or to a reference resistance;
   (d) a window comparator to compare the value of (V1−V2) to Vref and (V2−V1) to Vref, and adapted to generate an output of one of three states under the conditions:
      (1) (V1−V2)>Vref;
      (2) (V2−V1)>Vref;
      (3) (V1−V2)<Vref and (V2−V1)<Vref.

44. The apparatus of claim 43 wherein the magnetic memory element is moveable relative to a read and/or write component for the memory element.

45. A computing device in combination with the apparatus of claim 43.

46. The apparatus of claim 43 wherein the magnetic element is embodied in a moveable read and/or write head.

47. The apparatus of claim 43 wherein the magnetic memory is an MRAM device.

* * * * *